(12) United States Patent
Herron et al.

(10) Patent No.: US 10,944,200 B2
(45) Date of Patent: Mar. 9, 2021

(54) CONFIGURABLE DOCKING CONNECTOR

(71) Applicant: Virginia Panel Corporation, Waynesboro, VA (US)

(72) Inventors: Randall Herron, Waynesboro, VA (US); Christopher Church-Diciccio, Waynesboro, VA (US); Randall Garman, Waynesboro, VA (US); Darryl Ashby, Weyers Cave, VA (US); Jeffery P Stowers, Mount Sydney, VA (US)

(73) Assignee: Virginia Panel Corporation, Waynesboro, VA (US)

( * ) Notice: Subject to any disclaimer, the term of this patent is extended or adjusted under 35 U.S.C. 154(b) by 0 days.

(21) Appl. No.: 16/003,457

(22) Filed: Jun. 8, 2018

(65) Prior Publication Data

US 2018/0358735 A1     Dec. 13, 2018

Related U.S. Application Data

(60) Provisional application No. 62/516,971, filed on Jun. 8, 2017.

(51) Int. Cl.
*H01R 13/518* (2006.01)
*H01R 31/06* (2006.01)
*H01R 13/58* (2006.01)

(52) U.S. Cl.
CPC ....... *H01R 13/518* (2013.01); *H01R 13/5837* (2013.01); *H01R 31/06* (2013.01); *H01R 2201/20* (2013.01)

(58) Field of Classification Search
CPC .......... H01R 13/74–746; H01R 13/518; H01R 13/5837; H01R 31/06; H01R 2201/20
USPC ...................... 439/364, 701, 715, 716, 541.5
See application file for complete search history.

(56) References Cited

U.S. PATENT DOCUMENTS

| | | | | |
|---|---|---|---|---|
| 4,329,005 A * | 5/1982 | Braginetz | ................ | G01R 1/04 439/51 |
| 5,103,378 A * | 4/1992 | Stowers | ............... | H05K 7/1425 211/41.17 |
| 6,324,062 B1 * | 11/2001 | Treiber | .................. | G06F 1/181 312/223.2 |
| 7,091,415 B2 * | 8/2006 | Ashby | .................. | H05K 7/1421 174/50 |
| 8,348,693 B2 * | 1/2013 | Stowers | ............... | H01R 12/724 439/364 |
| 8,351,218 B2 * | 1/2013 | Stowers | ............... | H01R 13/514 361/810 |
| 9,257,787 B2 * | 2/2016 | Stowers | ............... | H01R 13/629 |
| 2002/0151207 A1 * | 10/2002 | Bates, III | ............. | G02B 6/3878 439/364 |
| 2003/0087537 A1 * | 5/2003 | Hubbard | .......... | H01R 13/62933 439/51 |
| 2003/0154673 A1 * | 8/2003 | MacGregor | .......... | A47B 83/001 52/239 |

(Continued)

*Primary Examiner* — Gary F Paumen
(74) *Attorney, Agent, or Firm* — 24IP Law Group USA, PLLC; Timothy R DeWitt

(57) ABSTRACT

A docking connector having two pairs of opposing sides forming a frame and first means on a first pair of opposing sides for mounting a plurality of connector modules in a first direction in the frame and second means on a second pair of sides for mounting a plurality of modules of a second size in a second direction where the second direction is perpendicular to the first direction.

9 Claims, 8 Drawing Sheets

(56) References Cited

U.S. PATENT DOCUMENTS

| | | | |
|---|---|---|---|
| 2005/0041408 A1* | 2/2005 | Burgers | G01R 1/04 |
| | | | 361/801 |
| 2005/0162836 A1* | 7/2005 | Briggs | G06F 1/181 |
| | | | 361/724 |
| 2006/0205253 A1* | 9/2006 | Stowers | H01R 13/62966 |
| | | | 439/157 |
| 2007/0075207 A1* | 4/2007 | Ma | H01R 13/518 |
| | | | 248/346.01 |
| 2008/0010923 A1* | 1/2008 | MacGregor | A47B 83/001 |
| | | | 52/239 |
| 2008/0220655 A1* | 9/2008 | Liao | H01R 13/22 |
| | | | 439/629 |
| 2016/0276778 A1* | 9/2016 | Beischer | H01R 13/514 |

\* cited by examiner

CONFIGURABLE DOCKING CONNECTOR

CROSS-REFERENCE TO RELATED APPLICATIONS

The present application claims the benefit of the filing date of U.S. Provisional Patent Application Ser. No. 62/516,971 filed by the present inventors on Jun. 8, 2017.

The aforementioned provisional patent application is hereby incorporated by reference in its entirety.

STATEMENT REGARDING FEDERALLY SPONSORED RESEARCH OR DEVELOPMENT

None.

BACKGROUND OF THE INVENTION

Field Of The Invention

The present invention relates to a docking connector for holding modules for connector pins.

Brief Description Of The Related Art

A variety of electrical interface devices exist for housing modules that hold electrical and/or pneumatic contacts of various types. Examples of such interface devices are disclosed in U.S. Pat. Nos. 7,091,415, 7,297,014, 8,348,693 and 9,257,787. These various types of interface devices each have a receiver side and a test adapter side where the receiver side is connected to or mounted on test equipment and the test adapter side is connected to a unit under test. When the test adapter, known as an "ITA," is mated to the receiver, a plurality of contact can be connected to each other in a stable and safe manner to minimize or eliminate damage to the contact during mating. The interface devices come in a wide variety of sizes that can hold small number of contacts or very large numbers of contacts.

The receiver and test adapter in an interface device typically each have a frame that holds a plurality of modules. The different types of interface devices often have modules of different dimensions such that modules from one interface type cannot be used in a different interface type. To overcome this problem, U.S. Pat. No. 8,351,218 discloses an interface device having multiple tiers such that modules of a first size can be mounted in the receiver or test adapter in one tier and modules of a second size can be mounted in the receiver or test adapter in a second tier. In this manner, modules of different sizes can be used simultaneously in the same interface device.

In small applications an engagement mechanism may not be necessary so a frame, referred to herein as a "docking connector," is used to hold connector modules filled with connector pins improve connection times. Exemplary prior docking connectors are shown in FIGS. 1A-1D and 2. Each of these prior docking connectors has two pairs of opposing sides to form a rectangular or square frame. As shown in the example in FIG. 1A, one pair of opposing sides, the top and bottom in FIG. 1A, has holes or other means for connecting a plurality of modules to the frame in a side-by-side manner. In other examples such as are shown in FIGS. 1B-1D, the frame includes intermediate members having holes or other means for connecting modules between the intermediate members and a side or between two intermediate members.

SUMMARY OF THE INVENTION

In a preferred embodiment, the present invention is a docking connector having two pairs of opposing sides forming a frame and first means on a first pair of opposing sides for mounting a plurality of connector modules in a first direction in the frame and second means on a second pair of sides for mounting a plurality of modules of a second size in a second direction where the second direction is perpendicular to the first direction.

In another preferred embodiment, the present invention is a configurable docking connector. The configurable docking connector comprises first and second pairs of opposing sides forming a rectangular frame having an opening formed by the first and second pairs of opposing sides for receiving a plurality of connector modules. The first pair of opposing sides each has a plurality of mounting means configured to mount a plurality of first connector modules of a first size to the first pair of opposing sides in the opening. The second pair of opposing sides each having a plurality of mounting means configured to mount a plurality of second modules of a second size different from the first size to the second pair of opposing sides in a second direction where the second direction is perpendicular to the first direction. The configurable docking connector may be a receiver frame or a test adapter frame of an electrical interface. The configurable docking connector may further comprise a plurality of contact modules mounted to each of the first pair of opposing sides. Alternatively, the configurable docking connector may further comprise a plurality of contact modules mounted to each of the second pair of opposing sides. The first pair of opposing sides each may have means for mounting a strain relief plate, such as a mounting surface or a mounting slot or hole.

In another preferred embodiment, the present invention is a configurable docking connector having a receiver comprised of first, second, third and fourth frame members arranged to form a rectangular frame having a central opening, the first and third frame members being parallel to one another and forming a length of the rectangular frame, and the second and fourth frame members being parallel to one another and forming a width of the rectangular frame, the width being less than the length. The first and third frame members each have a plurality of mounting means configured to mount contact modules to the first and third frame members across the central opening. The second and fourth frame members each have a plurality of mounting means configured to mount contact modules to the second and fourth frame members across the central opening. The receiver further may comprise an alignment hole in each of the first and third frame members of the receiver. The alignment holes may be polarized by being off-center in each of the first and third frame members.

The configurable docking connector may further comprise a test adapter configured to mate with the receiver. The test adapter may comprise first, second, third and fourth frame members arranged to form a rectangular frame having a central opening, the first and third frame members being parallel to one another and forming a length of the rectangular frame, and the second and fourth frame members being parallel to one another and forming a width of the rectangular frame, the width being less than the length. The first and third frame members each may have a plurality of mounting means configured to mount contact modules to the first and third frame members across the central opening. The second and fourth frame members each have a plurality of mounting means configured to mount contact modules to the second and fourth frame members across the central opening. The receiver further may comprise an alignment hole in each of the first and third frame members of the receiver and the test adapter further comprises an alignment pin extending from each of the first and third frame members of the test adapter. The alignment holes are polarized by being off-center in each of the first and third frame members of the receiver and the alignment pins are correspondingly polarized by being off-center in each of the first and third frame members of the test adapter. Alternatively, the test adapter further comprises an alignment hole in each of the first and third frame members of the test adapter and the receiver further comprises an alignment pin extending from each of the first and third frame members of the receiver. Again, the alignment holes may be polarized by being off-center in each of the first and third frame members of the test adapter and the alignment pins are correspondingly polarized by being off-center in each of the first and third frame members of the receiver.

Still other aspects, features, and advantages of the present invention are readily apparent from the following detailed description, simply by illustrating a preferable embodiments and implementations. The present invention is also capable of other and different embodiments and its several details can be modified in various obvious respects, all without departing from the spirit and scope of the present invention. Accordingly, the drawings and descriptions are to be regarded as illustrative in nature, and not as restrictive. Additional objects and advantages of the invention will be set forth in part in the description which follows and in part will be obvious from the description or may be learned by practice of the invention.

BRIEF DESCRIPTION OF THE DRAWINGS

For a more complete understanding of the present invention and the advantages thereof, reference is now made to the following description and the accompanying drawings, in which.

DETAILED DESCRIPTION OF THE PREFERRED EMBODIMENTS

Figure 1A:
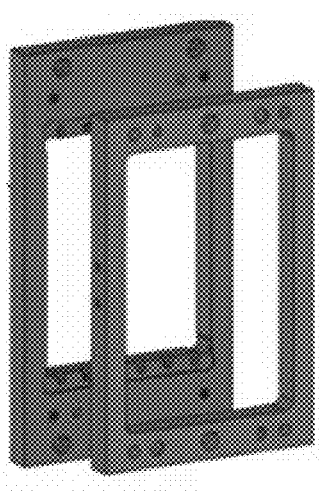
FIGS. 1A-1D are perspective view of prior art docking connectors.
Figure 1B:
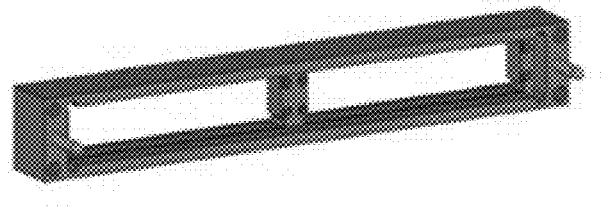
Figure 1C:
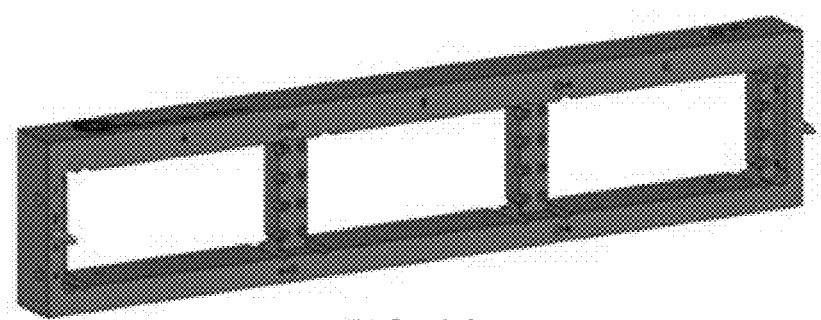
Figure 1D:
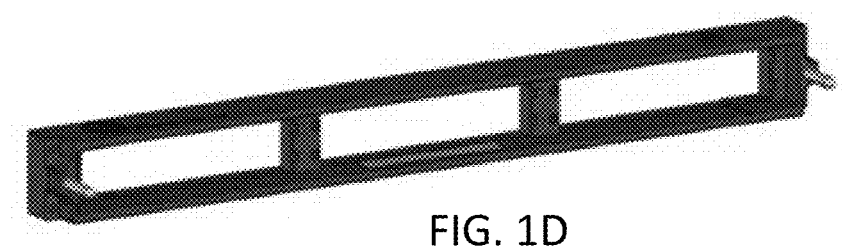
Figure 2:
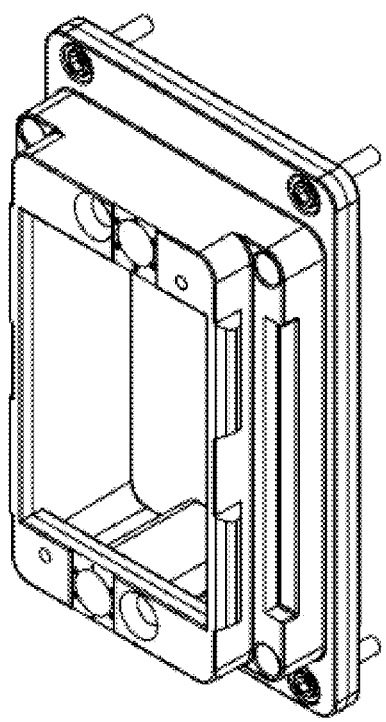
FIG. 2 is a perspective view of a prior art docking connector.

The preferred embodiments of the inventions are described with reference to the drawings. A first side 300 of a docking connector in accordance with a preferred embodiment of the present invention is shown in FIGS. 3A-3G. In this description, this first side will be referred to as the test adapter, but the two sides of the docking connector of the present invention could be reversed such that this first side would be connected to test equipment and therefore be a receiver. The test adapter 300 has a frame formed from two pairs of opposing members 310, 320 and 330, 340. In FIGS. 3A-3G, members 310, 320 could be referred to as the "top" and "bottom" while members 330, 340 could be referred to as sides, but the docking connector can be oriented perpendicular to that shown in FIGS. 3A-3G and thus the top/bottom and sides nomenclature would be reversed.

Opposing members 310, 320 respectively have holes 312, 322 for mounting a plurality of connector modules of a first size between the members 310, 320. Opposing members 330, 340 respectively have holes 332, 342 for mounting a plurality of connector modules of a second size between the members 330, 340. Thus, as shown in FIGS. 3F and 3G, when modules 610, 620, 630, 640 of the first size are mounted in the frame between members 310, 320 they would have their length in a first direction (vertical in FIG. 3G) and when modules 510, 520 of the second size are mounted in the frame between members 330, 340 they would have their length in a second direction (horizontal in FIG. 3F) that is perpendicular to the first direction. In this manner, a single docking connector may be used alternatively to house to different sizes of modules. Each of the first plurality of modules or the second plurality of modules may be different types, meaning that they could hold different kinds of connectors or different mixtures of connectors.

Figure 3A:
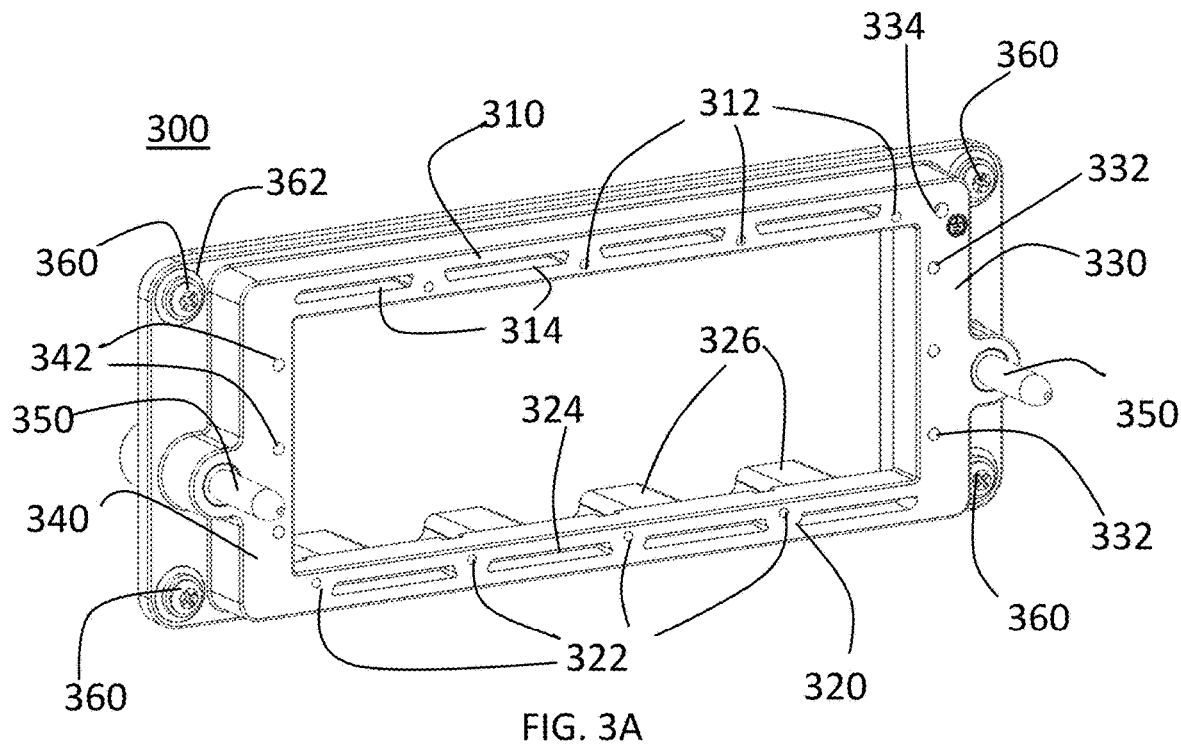
FIG. 3A is a front perspective view of a first side of a docking connector in accordance with a preferred embodiment of the present invention.
Figure 3B:
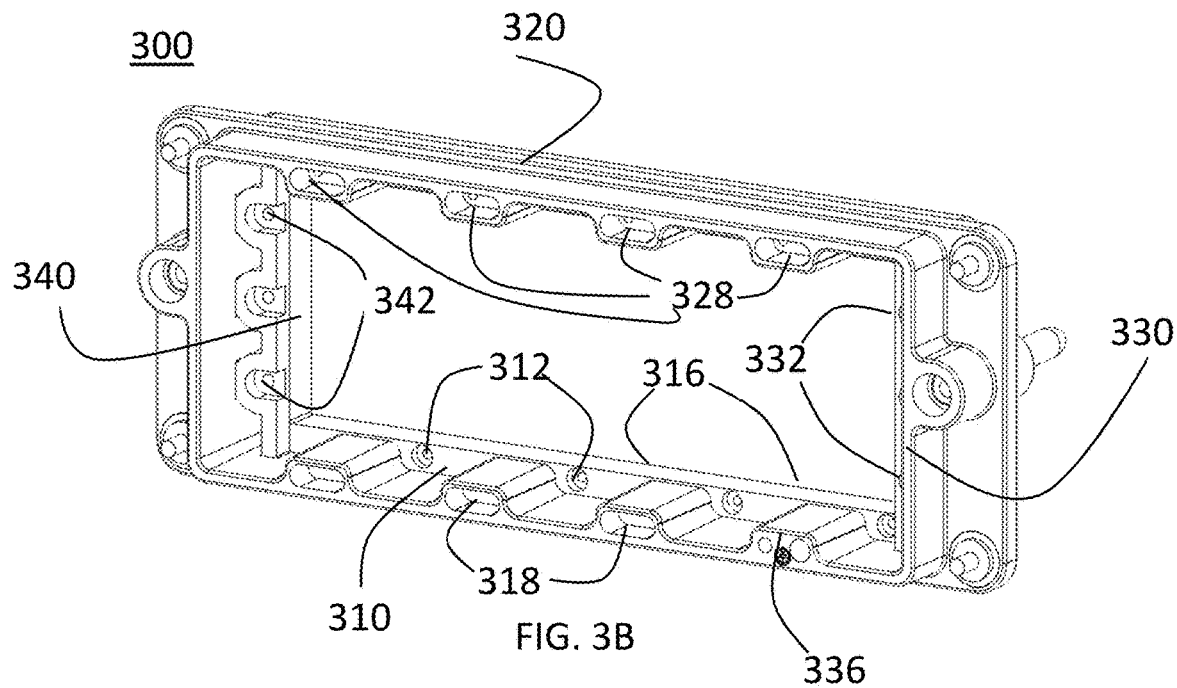
FIG. 3B is a rear perspective view of a first side of a docking connector in accordance with a preferred embodiment of the present invention.
Figure 3C:
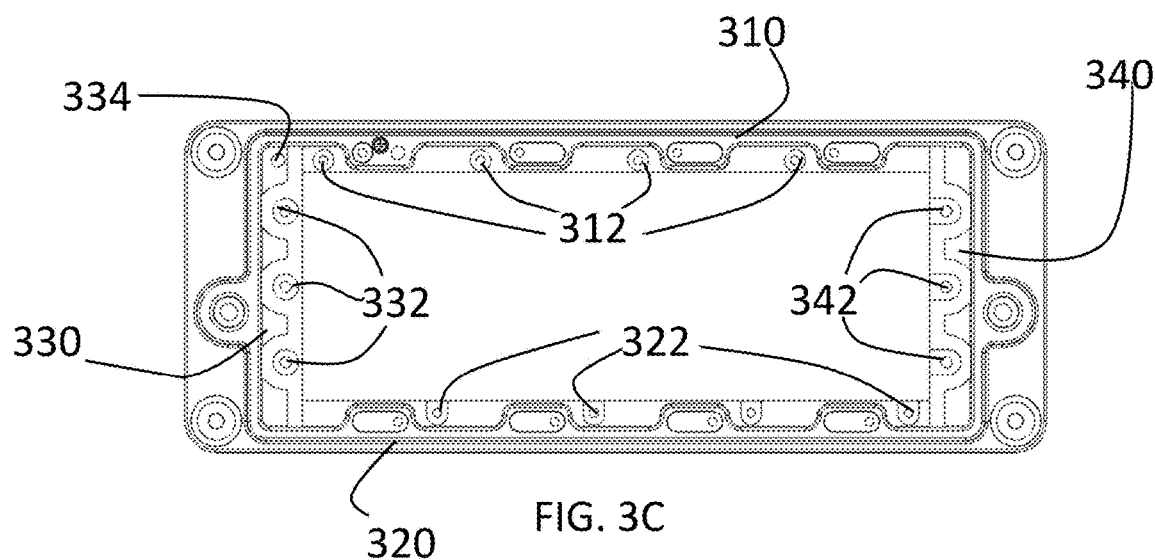
FIG. 3C is a front view of a first side of a docking connector in accordance with a preferred embodiment of the present invention.
Figure 3D:
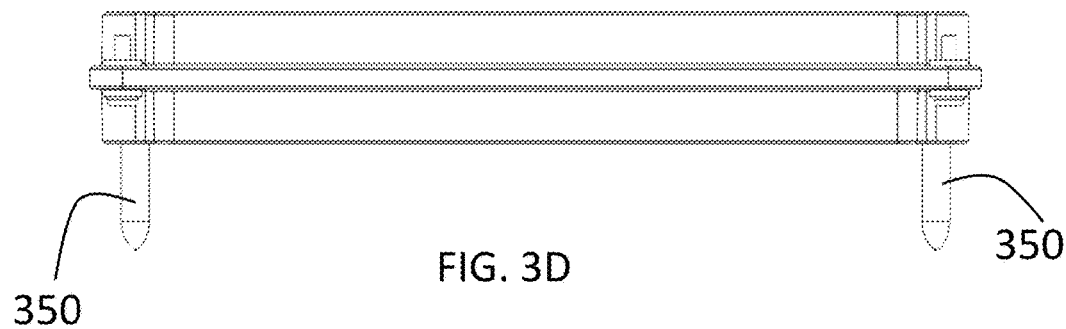
FIG. 3D is a side view of a first side of a docking connector in accordance with a preferred embodiment of the present invention.
Figure 3E:
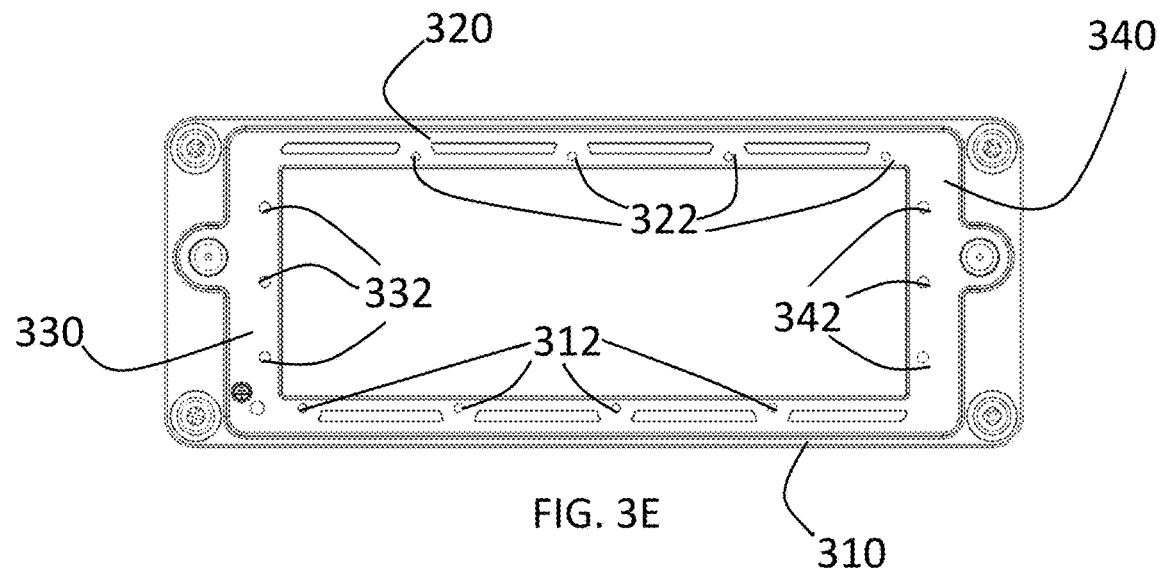
FIG. 3E is a rear view of a first side of a docking connector in accordance with a preferred embodiment of the present invention.
Figure 3F:
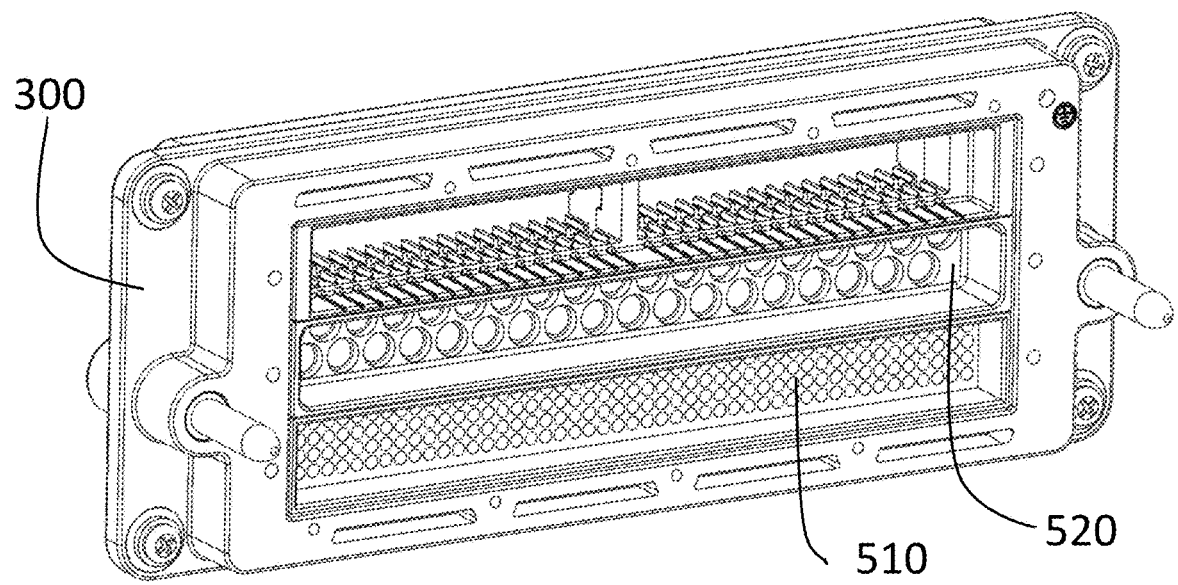
FIG. 3F is a front perspective view of a first side of a docking connector in accordance with a preferred embodiment of the present invention with a plurality of modules of a first size mounted in the docking connector in a first direction.
Figure 3G:
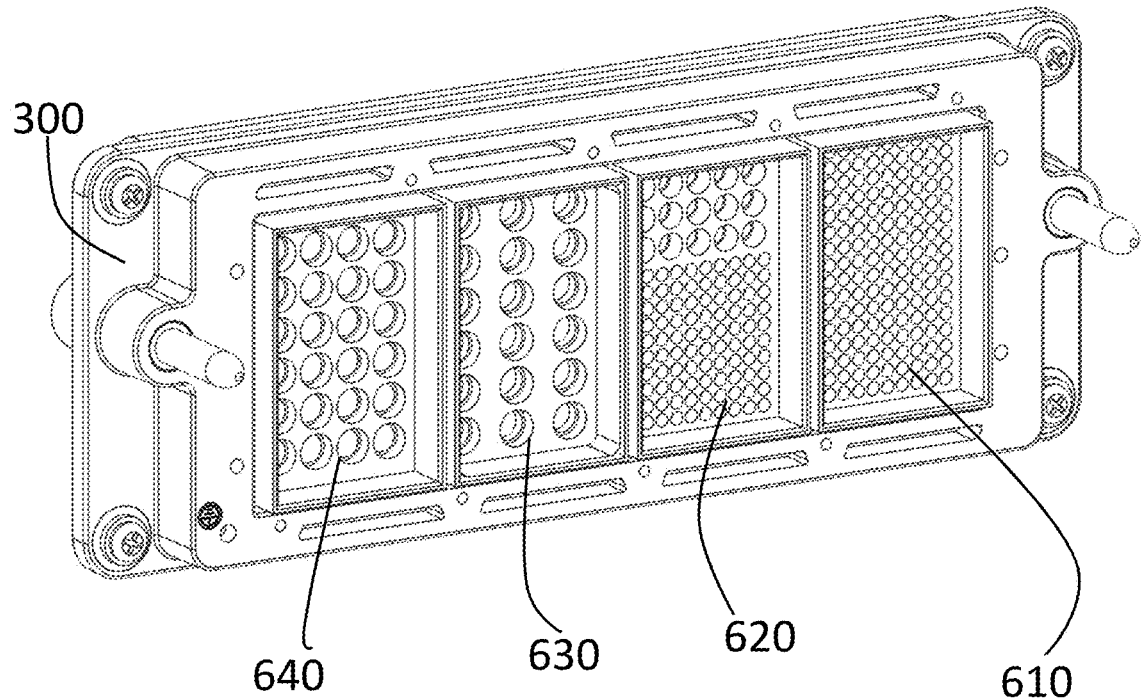
FIG. 3G is a front perspective view of a first side of a docking connector in accordance with a preferred embodiment of the present invention with a plurality of modules of a second size mounted in the docking connector in a second direction perpendicular to the first direction.

As shown in FIG. 3A, the first side 300 of the docking connector has surfaces 316 and 326 on members 310 and 320 for mounting strain relief plates to support various types of wires. Members 310, 320 further have slots 318 and 328 for mounting strain relief plates. It further may have coring 314, 324 to reduce the mass of the docking connector. The docking connector, for example, may be die cast or machined metal. The docking connector has mounting screws 360 to mount the first side 300 to test equipment or to a unit under test. There is a floating bushing (not shown) and a washer 362 beneath the head of each screw 360. The washer 362 may be a low friction material such as nylon. The first side 300 of the docking connector further has alignment pins 350 for aligning the first side 300 with the second side 400, which has corresponding holes 450 for receiving the pins 300. The pins 350 are off-center, i.e., close to member 320 than to member 310, to provide polarization to ensure that the two sides 300, 400 of the docking connector are properly placed together. The first side 300 further has tapped holes 334 (in FIG. 3A) and 336 (in FIG. 3B) for an earth ground screw.

While FIGS. 3A-3G show a first side 300 of a docking connector, FIGS. 4A-4G show a second side 400 of a docking connector that mates with the first side 300. Since the first side 300 was referred to as a test adapter above, the second side 400 will be referred to herein as a receiver 400. One of skill in the art, however, will understand that the first and second sides could be arranged in an opposite manner.

The receiver 400 has a frame formed from two pairs of opposing members 410, 420 and 430, 440. In FIGS. 4A-4G, members 410, 420 could be referred to as the "top" and "bottom" while members 430, 440 could be referred to as sides, but the docking connector can be oriented perpendicular to that shown in FIGS. 4A-4G and thus the top/bottom and sides nomenclature would be reversed.

Opposing members 410, 420 respectively have holes 412, 422 for mounting a plurality of connector modules of a first size to and between the members 410, 420. Opposing members 430, 440 respectively have holes 432, 442 for mounting a plurality of connector modules of a second size to and between the members 430, 440. Thus, as shown in FIGS. 4F and 4G, when modules 810, 820, 830, 840 of the first size are mounted in the frame between members 410, 420 they would have their length in a first direction (vertical in FIG. 4G) and when modules 710, 720, 730 of the second size are mounted in the frame between members 430, 440 they would have their length in a second direction (horizontal in FIG. 4F) that is perpendicular to the first direction. In this manner, a single docking connector may be used alternatively to house to different sizes of modules. Each of the first plurality of modules or the second plurality of modules may be different types, meaning that they could hold different kinds of connectors or different mixtures of connectors.

Figure 4A:
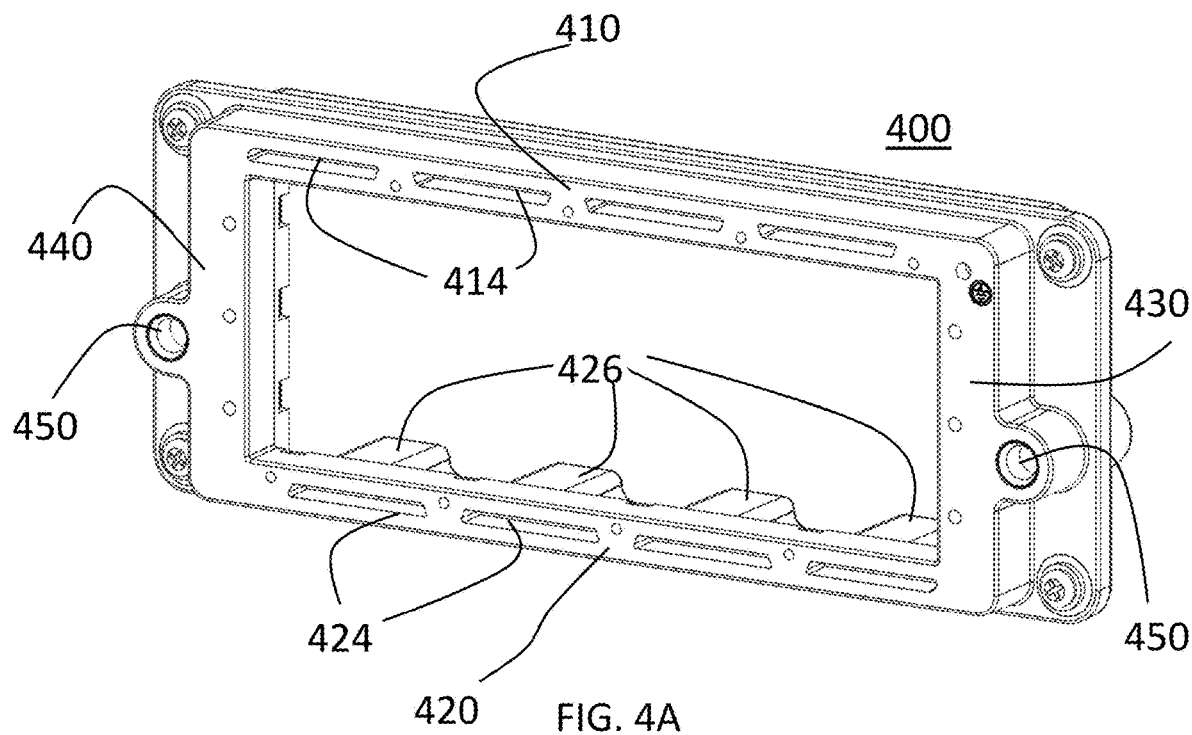
FIG. 4A is a front perspective view of a second side of a docking connector in accordance with a preferred embodiment of the present invention.
Figure 4B:
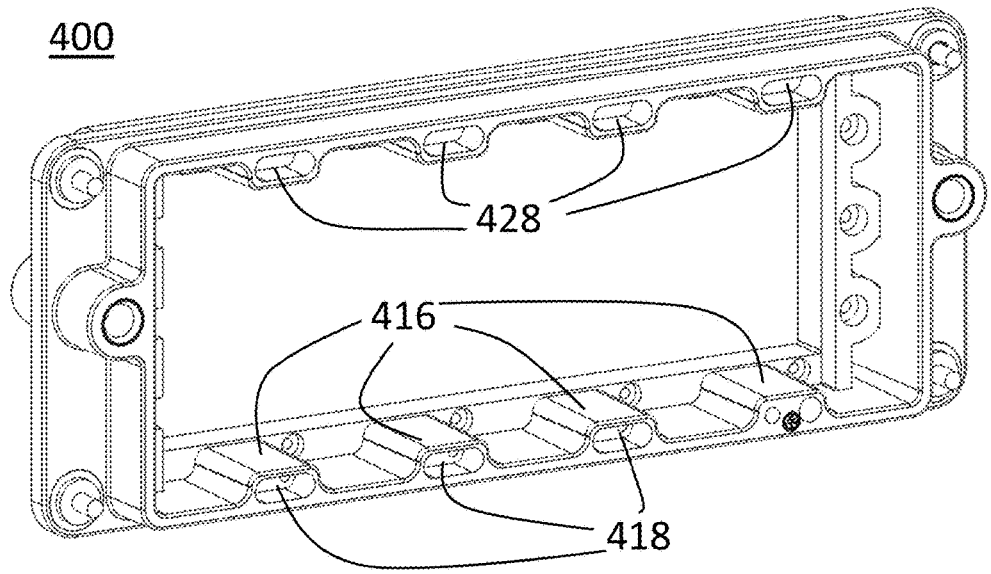
FIG. 4B is a rear perspective view of a second side of a docking connector in accordance with a preferred embodiment of the present invention.
Figure 4C:
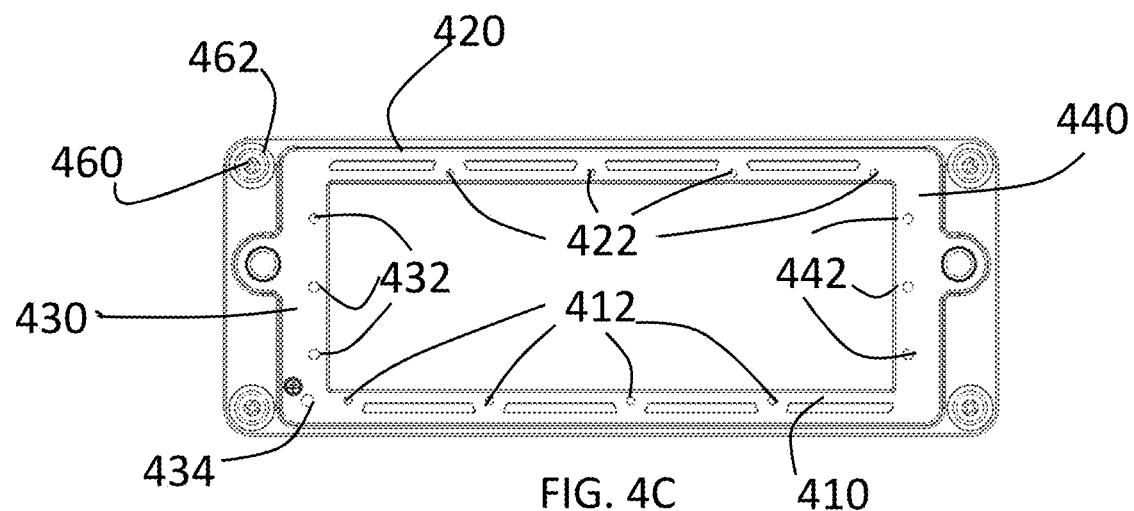
FIG. 4C is a front view of a second side of a docking connector in accordance with a preferred embodiment of the present invention.
Figure 4D:
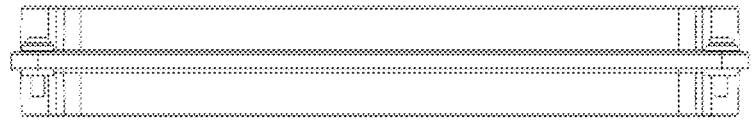
FIG. 4D is a side view of a second side of a docking connector in accordance with a preferred embodiment of the present invention.
Figure 4E:
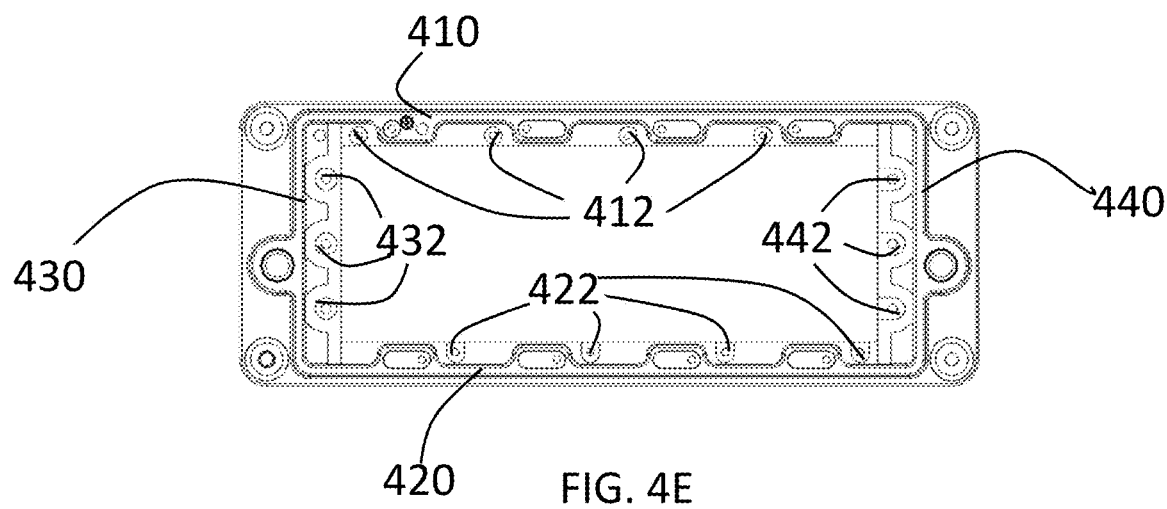
FIG. 4E is a rear view of a second side of a docking connector in accordance with a preferred embodiment of the present invention.
Figure 4F:
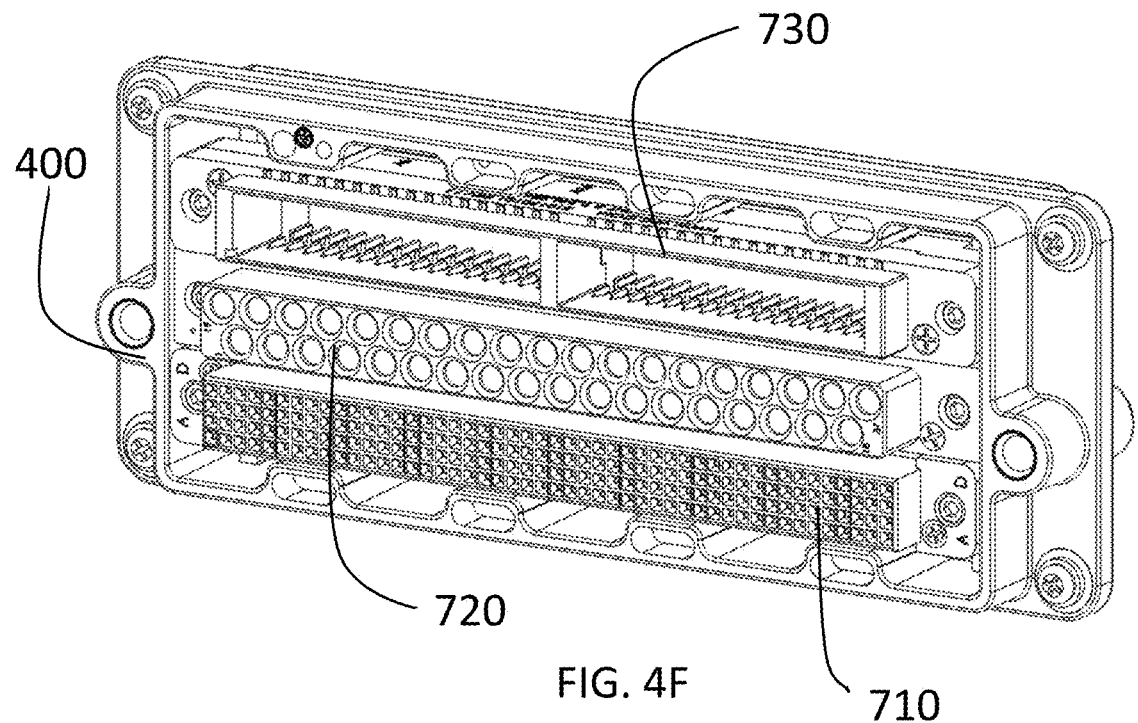
FIG. 4F is a front perspective view of a second side of a docking connector in accordance with a preferred embodiment of the present invention with a plurality of modules of a first size mounted in the docking connector in a first direction.
Figure 4G:
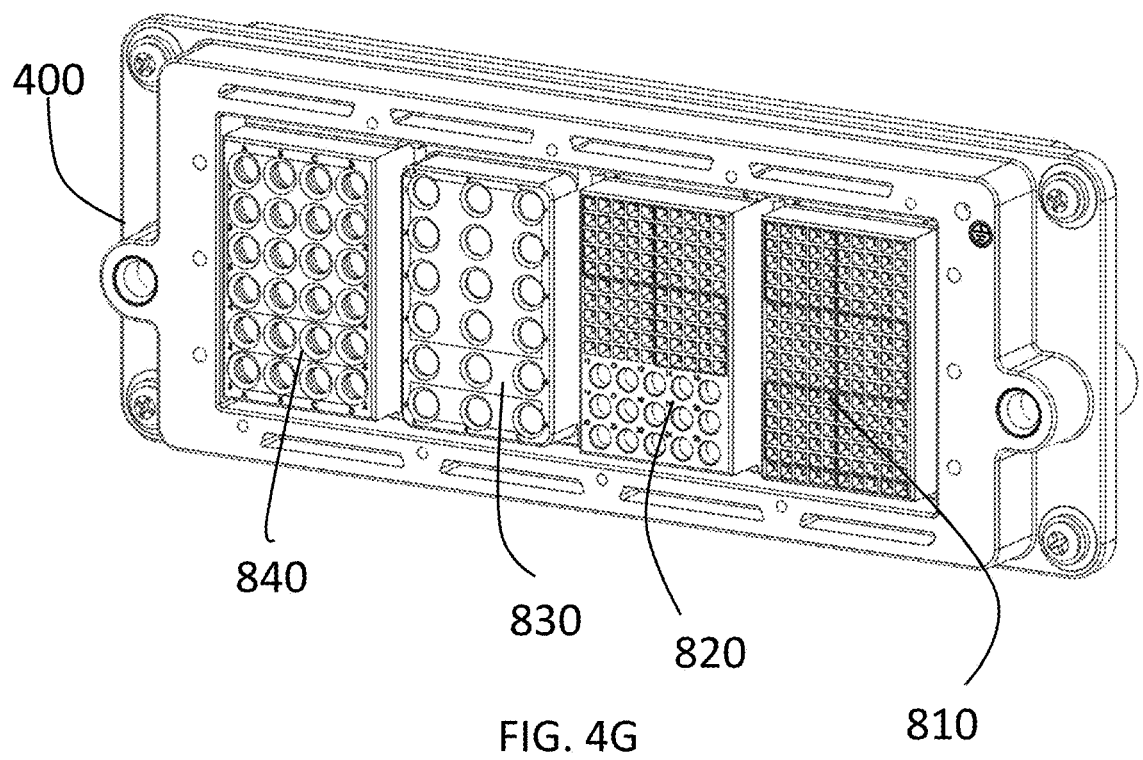
FIG. 4G is a front perspective view of a second side of a docking connector in accordance with a preferred embodiment of the present invention with a plurality of modules of a second size mounted in the docking connector in a second direction perpendicular to the first direction.

As shown in FIG. 4A, the second side 400 of the docking connector has surfaces 416 and 426 on members 410 and 420 for mounting strain relief plates to support various types of wires. Members 410, 420 further have slots 418 and 428 for mounting strain relief plates. It further may have coring 414, 424 to reduce the mass of the docking connector. The docking connector has mounting screws 460 to mount the second side 400 to test equipment or to a unit under test. There is a floating bushing (not shown) and a washer 462 beneath the head of each screw 460. Again, the washer 462 may be a low friction material such as nylon. The second side 400 of the docking connector further has alignment 450 for aligning the second side 400 with the first side 300, which has corresponding alignment pins 350 that are received the alignment holes 450 when the first and second sides are mated. The alignment holes 450 are off-center, i.e., closer to member 420 than to member 410, to provide polarization to ensure that the two sides 300, 400 of the docking connector are properly placed together. The second side 400 further has tapped holes 434 (in FIG. 4A) and 436 (in FIG. 4B) for an earth ground screw.

The foregoing description of the preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments as are suited to the particular use contemplated. It is intended that the scope of the invention be defined by the claims appended hereto, and their equivalents. The entirety of each of the aforementioned documents is incorporated by reference herein.

What is claimed is:

1. An interface device comprising:
  a first configurable docking connector comprising:
    first, second, third and fourth frame members arranged to form a rectangular frame having a central opening, said first and third frame members being parallel to one another and forming a length of said rectangular frame, and said second and fourth frame members being parallel to one another and forming a width of said rectangular frame, said width being less than said length; and
    an alignment hole in at least one of said first, second, third and fourth frame members configured to align said first docking connector with a second docking connector for engagement of said second docking connector to said first docking connector;
    wherein said first and third frame members each have a plurality of mounting means configured to mount connector modules to said first and third frame members across said central opening; and
    wherein said second and fourth frame members each have a plurality of mounting means configured to mount connector modules to said second and fourth frame members across said central opening and
  a second configurable docking connector comprising:
    first, second, third and fourth frame members arranged to form a rectangular frame having a central opening, said first and third frame members being parallel to one another and forming a length of said rectangular frame, and said second and fourth frame members being parallel to one another and forming a width of said rectangular frame, said width being less than said length;
    wherein said first and third frame members each have a plurality of mounting means configured to mount connector modules to said first and third frame members across said central opening; and
    wherein said second and fourth frame members each have a plurality of mounting means configured to mount connector modules to said second and fourth frame members across said central opening;
    wherein said interface further comprises an alignment hole in each of said first and third frame members of said first docking connector and said second docking connector further comprises an alignment pin extending from each of said first and third frame members of said second docking connector.

2. An interface device according to claim 1 further comprising a plurality of independent connector modules mounted to each of said first and third frame members of said first configurable docking connector.

3. An interface device according to claim 1 further comprising a plurality of independent connector modules mounted to each of said second and fourth frame members of said first configurable docking connector.

4. An interface device according to claim 1 wherein said first and third frame members of said first configurable docking connector each have means for mounting a strain relief plate.

5. An interface device according to claim 1 wherein said at least one alignment hole further comprises an alignment hole in each of said first and third frame members of said first configurable docking connector.

6. An interface device according to claim 5 wherein each said alignment hole is polarized by being off-center in each of said first and third frame members.

7. An interface device according to claim 1 wherein said alignment holes are polarized by being off-center in each of said first and third frame members of said receiver and said alignment pins are correspondingly polarized by being off-center in each of said first and third frame members of said second docking connector.

8. An interface device according to claim 1 wherein said second docking connector further comprises an alignment hole in each of said first and third frame members of said test adapter and said receiver further comprises an alignment pin extending from each of said first and third frame members of said first docking connector.

9. An interface device according to claim 8 wherein said alignment holes are polarized by being off-center in each of said first and third frame members of said test adapter and said alignment pins are correspondingly polarized by being off-center in each of said first and third frame members of said first docking connector.

\* \* \* \* \*